(12) United States Patent
Frazier et al.

(10) Patent No.: US 9,057,535 B2
(45) Date of Patent: Jun. 16, 2015

(54) SOLAR ENERGY CONVERSION DEVICES AND SYSTEMS

(75) Inventors: Scott Frazier, Fletcher, NC (US); Rik Deaton, Maungawera (NZ)

(73) Assignee: MBC Ventures, Inc., Baltimore, MD (US)

( * ) Notice: Subject to any disclaimer, the term of this patent is extended or adjusted under 35 U.S.C. 154(b) by 66 days.

(21) Appl. No.: 12/349,728

(22) Filed: Jan. 7, 2009

(65) Prior Publication Data

US 2009/0173375 A1 Jul. 9, 2009

Related U.S. Application Data

(63) Continuation of application No. PCT/US2007/073135, filed on Jul. 10, 2007.

(60) Provisional application No. 60/819,379, filed on Jul. 10, 2006.

(51) Int. Cl.
*H01L 31/024* (2014.01)
*F24J 2/04* (2006.01)
(Continued)

(52) U.S. Cl.
CPC *F24J 2/0433* (2013.01); *F24J 2/10* (2013.01); *F24J 2/30* (2013.01); *F24J 2/40* (2013.01);
(Continued)

(58) Field of Classification Search
USPC ............... 136/243–265, 456; 438/57–98; 126/569, 571, 573, 600, 683, 686, 690, 126/702; 250/203.1, 203.4
See application file for complete search history.

(56) References Cited

U.S. PATENT DOCUMENTS

| 2,288,465 A | 6/1942 | Knudsen |
| 2,595,905 A | 5/1952 | Telkes |

(Continued)

FOREIGN PATENT DOCUMENTS

| JP | 57142444 | 9/1983 |
| JP | 58179771 | 10/1983 |

(Continued)

OTHER PUBLICATIONS

Supplementary European Search Report issued by the European Patent Office in corresponding European Patent Application No. 09805585 on Mar. 5, 2014.

(Continued)

*Primary Examiner* — Christina Chern
(74) *Attorney, Agent, or Firm* — Whiteford, Taylor & Preston, LLP; Joseph L. Morales

(57) ABSTRACT

Methods and devices are presented that allow the harvest of electricity, heat and lighting simultaneously from a solar converter, often at less cost than conventional solar collectors. The converters use slats to intercept sunlight. Slat surfaces in the direct light path may be coated with photovoltaic (PV) material, or may be shaped to concentrate sunlight, allowing less PV material to capture reflected, concentrated light for improved economics. Forcing air flow past enclosed slats let the slats operate as PV heat sinks, heat absorbers, and heat exchangers capturing much of the solar energy that is not converted to electricity, as heat. Embodiments also allow passage of indirect light to supplement interior artificial lighting, often with positive aesthetic effects. These slatted apertures mitigate glare and overheating problems associated with typical skylights and some windows, allowing wider use as architectural elements. The devices also can be integrated into new building construction, and serve a dual purpose as building structural components.

18 Claims, 12 Drawing Sheets

(51) Int. Cl.
| | | |
|---|---|---|
| *F24J 2/10* | (2006.01) | |
| *F24J 2/30* | (2006.01) | |
| *F24J 2/40* | (2006.01) | |
| *F24J 2/52* | (2006.01) | |
| *F24J 2/54* | (2006.01) | |
| *H01L 31/0525* | (2014.01) | |
| *H01L 31/052* | (2014.01) | |

(52) U.S. Cl.
CPC ............... *F24J 2/5239* (2013.01); *F24J 2/541* (2013.01); *H01L 31/058* (2013.01); *H01L 31/0521* (2013.01); *H01L 31/0525* (2013.01); *F24J 2002/0411* (2013.01); *F24J 2002/1014* (2013.01); *F24J 2002/108* (2013.01); *F24J 2002/5468* (2013.01); *Y02B 10/14* (2013.01); *Y02B 10/20* (2013.01); *Y02B 10/70* (2013.01); *Y02E 10/44* (2013.01); *Y02E 10/47* (2013.01); *Y02E 10/52* (2013.01); *Y02E 10/60* (2013.01)

(56) References Cited

U.S. PATENT DOCUMENTS

| | | | | |
|---|---|---|---|---|
| 2,651,085 | A | | 9/1953 | Kopp |
| 3,077,643 | A | * | 2/1963 | Horner ............................ 52/473 |
| 3,437,818 | A | | 4/1969 | Shattuck |
| 3,832,853 | A | | 9/1974 | Butler, Jr. |
| 3,981,445 | A | | 9/1976 | Custer |
| 3,982,527 | A | | 9/1976 | Cheng et al. |
| 4,026,269 | A | | 5/1977 | Stelzer |
| 4,034,736 | A | | 7/1977 | Telkes |
| 4,106,483 | A | | 8/1978 | Barber, Jr. |
| 4,137,098 | A | * | 1/1979 | Field ............................ 136/248 |
| 4,143,640 | A | | 3/1979 | Pierce |
| 4,153,474 | A | | 5/1979 | Rex |
| 4,159,707 | A | * | 7/1979 | Miquel ........................ 126/702 |
| 4,180,414 | A | * | 12/1979 | Diamond et al. ............. 136/246 |
| 4,220,137 | A | | 9/1980 | Tesch et al. |
| 4,279,240 | A | | 7/1981 | Artusy |
| 4,281,488 | A | | 8/1981 | Resibois |
| 4,301,787 | A | | 11/1981 | Rice |
| 4,321,416 | A | | 3/1982 | Tennant |
| 4,351,320 | A | | 9/1982 | Tetirick |
| 4,401,103 | A | | 8/1983 | Thompson |
| 4,410,757 | A | * | 10/1983 | Stamminger et al. ......... 136/248 |
| 4,520,794 | A | | 6/1985 | Stark et al. |
| 4,567,316 | A | * | 1/1986 | Hollaus et al. ................ 136/246 |
| 4,577,619 | A | | 3/1986 | Howe, Jr. |
| 4,658,806 | A | | 4/1987 | Boozer |
| 4,690,355 | A | * | 9/1987 | Hornung et al. ........... 244/172.8 |
| 4,883,340 | A | * | 11/1989 | Dominguez .................. 359/593 |
| 5,115,612 | A | | 5/1992 | Newton et al. |
| 5,128,181 | A | | 7/1992 | Kunert |
| 5,131,955 | A | | 7/1992 | Stern et al. |
| 5,180,441 | A | * | 1/1993 | Cornwall et al. .............. 136/246 |
| 5,221,363 | A | | 6/1993 | Gillard |
| 5,344,496 | A | | 9/1994 | Stern et al. |
| 5,413,161 | A | * | 5/1995 | Corazzini ........................ 160/7 |
| 6,029,656 | A | | 2/2000 | Schwarz |
| 6,134,842 | A | | 10/2000 | Cheng et al. |
| 6,276,359 | B1 | | 8/2001 | Frazier |
| 6,372,978 | B1 | | 4/2002 | Cifaldi |
| 6,528,782 | B1 | | 3/2003 | Zhang et al. |
| 6,971,756 | B2 | | 12/2005 | Vasylyev et al. |
| 7,352,509 | B2 | | 4/2008 | Pagel |
| 7,617,857 | B2 | | 11/2009 | Froese |
| 2003/0038610 | A1 | | 2/2003 | Munshi et al. |
| 2003/0168056 | A1 | | 9/2003 | Fidler |
| 2005/0133086 | A1 | | 6/2005 | Itoyama et al. |
| 2007/0034247 | A1 | | 2/2007 | Takada et al. |
| 2007/0056579 | A1 | | 3/2007 | Straka |
| 2007/0235021 | A1 | | 10/2007 | Reed et al. |
| 2008/0250735 | A1 | | 10/2008 | Patterson |
| 2009/0000613 | A1 | | 1/2009 | Edwards et al. |
| 2009/0255567 | A1 | | 10/2009 | Frolov et al. |
| 2009/0320388 | A1 | | 12/2009 | Lilli et al. |
| 2010/0079387 | A1 | | 4/2010 | Rosenblatt et al. |
| 2010/0147353 | A1 | | 6/2010 | Kamath |
| 2011/0214712 | A1 | | 9/2011 | Frazier |

FOREIGN PATENT DOCUMENTS

| | | |
|---|---|---|
| JP | 60120143 | 6/1985 |
| JP | 05178298 | 7/1993 |
| JP | 2007231613 | 9/2007 |
| WO | WO 02/16707 A1 | 2/2002 |
| WO | 02084182 | 10/2002 |

OTHER PUBLICATIONS

Non-final Office Action issued by the United States Patent and Trademark Office in corresponding U.S. Appl. No. 13/056,487, filed Jun. 19, 2014.

* cited by examiner

Figure 4b – view from under slats 930
940
910 - dams
920 - linkers
900

900
910
920
1100

900
910
920
1100

South (Equator)

SOLAR ENERGY CONVERSION DEVICES AND SYSTEMS

RELATED APPLICATIONS

This application claims priority based from prior PCT application No. PCT/US07/73135 filed on Jul. 10, 2007, and US provisional Application No. 60/819,379 filed on Jul. 10, 2006, the entire contents of each are incorporated herein by reference.

FIELD OF THE INVENTION

The invention relates to radiant energy conversion devices generally, to the capture and conversion of solar energy into heat and electricity and to building design and control of energy conversion and usage systems.

BACKGROUND OF THE INVENTION

Solar generation and cogeneration systems are becoming a logical alternative or addition to fossil fueled energy systems as fuel costs increase. The solar heat that is simultaneously collected with electricity provides a major boost to an energy system's value. Unfortunately, however "solar cogeneration" systems need to be located at the site of use, which presents challenges to most existing or previous photovoltaic concentrator methods. Since the collected heat generally is at low temperature (typically 40-80 degrees C.), the heat energy cannot be transmitted far without substantial parasitic losses. Further, the capital cost of hot water and other heat transmission systems favors direct on site use. And, such low temperature heat generally cannot be converted in a heat engine to mechanical or electrical power because of the small temperature differential versus ambient temperatures. Accordingly, systems are needed that harvest light energy and transfer the harvested energy easily to the heating, lighting and electricity requirements at the site of use, such that the immediate needs of the site are factored into how the system is controlled.

Solar cogeneration technologies are held back by challenges in building optical systems that are both inexpensive and that can be mounted or integrated into a building. One problem is the practical limit for how tall a design can be to withstand forces from windy conditions on the device and building on which it may be mounted. Tying a cogeneration apparatus into the foundation or load bearing structure of a building creates expensive installations and/or mounting systems to accommodate system stresses, particularly on the roof. Many commercial sites lack sufficient ground space for a reasonably sized system and roof-mounting is the only viable option to get sufficient collector area. Thus, systems are needed that can be built into or added on to existing buildings easily and that use inexpensive materials.

Several inventions address these needs but leave many problems unsolved. For example, U.S. Pat. No. 4,690,355 teaches the use of silvered mirror slats that are coordinately controlled, but such assembly is placed on a mast and left exposed to the elements. A high cost system designed to protect solar cells from solar wind while dissipating heat only as radiant energy in space is described in U.S. Pat. No. 5,180,441. This space-based system uses thick slats and very small solar cells, while relying on a much larger surface area to dissipate heat in the absence of air (no convective cooling). The system uses a very small solar cell area with high precision reflectors that do not easily accommodate changes in radiation angle. Multiple plate designs also are presented in U.S. Pat. Nos. 4,034,736 and 4,159,707, but these require multiple reflections of light to absorb energy. U.S. Pat. No. 4,143,640 likewise teaches a Venetian blind structure, but uses thick slats with heat transfer fluid inside, which likewise is impractical.

Other problems of solar harvesting systems arise from limitations of optics used, which can be classified broadly as either reflecting or refracting optics. Refraction optics is non-linear, which limits sunlight concentration when the incidence angle of incoming light varies with respect to an optical surface. Refracting optics require focusing to track sun direction in two axes, or in one axis combined with tilt of the entire system for the second axis, with comparatively expensive structural and mechanical implications. The use of such complicated tracking systems to orient optics at the sun in 2 axes (azimuth and elevation), generally require larger apertures (collector areas) to average the cost of the complicated tracking system into a device that collects more energy. This exacerbates challenge of roof mounting such 2-axis designs. Accordingly, any technology that alleviates the need to track sunlight in a second axis would be a great improvement and can advance this industry.

SUMMARY OF THE INVENTION

The problems affecting solar energy collection technology such as efficiency and cost are addressed via embodiments of a solar harvesting apparatus and methods of its use and incorporation into building structures. One embodiment provides an electromagnetic energy harvesting apparatus, comprising: a front light transmissive cover; a rear cover; a spacing between the covers that make the covers generally parallel with each other; and an array of parallel slats upon which the light impinges. Photovoltaic (PV) cells convert photons into electricity and these are used to convert some of the light to electricity with much of the remaining incoming energy converting to heat. Air is forced through the cavity containing the warm slats and useful heat can be harvested. Apply the PV material to the sides of the slats facing the sun is straightforward and the product, with heat and electricity being generated—as well as diffuse skylight and secondarily reflected direct sunlight can provide useful light to the space behind the apparatus—makes this apparatus economically attractive vs. many other solar collection systems.

A further innovation, constructing the slats with certain concave shapes facing the incoming light, with appropriate slat orientation, and a specularly reflecting concave surface can create a region of higher intensity light on the back side a nearby slat. Putting PV cells in this region allows a smaller, less expensive area of PV cells to be used to generate similar amounts of power.

Another embodiment provides a light gathering apparatus, comprising: a first light transmissive cover over a large surface of the array; a second cover over a large rear surface of the array; a spacing between the light transmissive covers, with the covers parallel to each other; an array of parallel arranged slats within the spacing and held together at least in part by two or more bars attached to slats of the array, the bars having characteristic heights measured from point of attachment outwards perpendicular to the first light transmissive cover; and one or more elongated obstructions attached to the second cover and positioned parallel to the two or more perpendicular bars at a non-occluding position, wherein the height of each one or more elongated obstructions as extending out perpendicular from the light transmissive cover is long enough to interfere with air flow near the surface(s) of the transmissive covers or to assist in directing the flow rates in different parts of the enclosure. Yet another embodiment provides an electromagnetic energy harvesting apparatus, comprising at least one: array of parallel arranged curved slats, each slat having a concave curved front side with a reflective surface, and a convex curved rear side with a photovoltaic energy converter on at least a portion of the rear side; a light transmissive cover on a large front surface of the array; a light transmissive cover on a large rear surface of the array; and a rod perpendicular to the slats as a slat positioner to coordinately open and close the slats while maintaining the slats in a parallel relationship.

Another embodiment provides a rooftop light energy harvesting apparatus, comprising: a single paned light transmissive cover facing out; a double paned light transmissive cover facing in; a spacing between the light transmissive covers, making the covers parallel with each other; and an array of parallel arranged curved slats within the spacing, each slat having a concave curved front side towards the single paned cover with a reflective surface, and a convex curved rear side with a photovoltaic energy converter on at least a portion of the rear side facing the double paned cover, and wherein the slats are of approximately equal length, so that the slat ends form an edge.

Yet another embodiment provides a rooftop or window system for harvesting light and heat from the sun, comprising: a first light transmissive cover facing out; a second light transmissive cover facing in; a spacing between the light transmissive covers, making the covers generally parallel with each other; an array of parallel arranged curved slats within the spacing, each slat having a concave curved surface facing the first light transmissive cover, and a convex curved rear light absorbing surface facing the second light transmissive cover, and wherein the slats are of approximately equal length, so that the slat ends form an edge; an airway on each edge of the array to allow forced air to flow along the long length of the curved slats; a pivoting mechanism to adjust the angle of the curved front side of the slats with respect to light from the first transmissive cover; a sensor that generates signals corresponding to inside light; and a controller; wherein the controller adjusts the pivoting mechanism in response to detected light to maintain a constant light level.

Yet another embodiment provides an automated system that responds to energy input or demand for a heat load, comprising a converter as described herein, and further comprising a computer, at least one sensor for detecting at least light or temperature, and at least one signal output to an actuator for adjusting slat position. In an embodiment, the automated system further comprises a light sensor located in the enclosure interior. The automated system further may comprise a feedback circuit or software that responds to output from the light sensor in the enclosure interior by adjusting slat position to maintain a constant light level within the enclosure interior.

The automated system may control a building, and comprise a temperature sensor within the building, wherein a signal from the building temperature sensor is input to the computer for control of slat position to maintain a desired temperature.

The automated system further may comprise a front light transmissive cover that is integrated as part of a building's weather envelope.

Many other embodiments are presented and also will be appreciated by a skilled reader.

DESCRIPTION OF THE DRAWINGS

FIG. 4 shows a slat movement mechanism without linkage bars on the outside of the slats. FIG. 4b is an isometric view from below the slats showing better how the features are dispersed along the slat length.

DETAILED DESCRIPTION

Figure 1A:
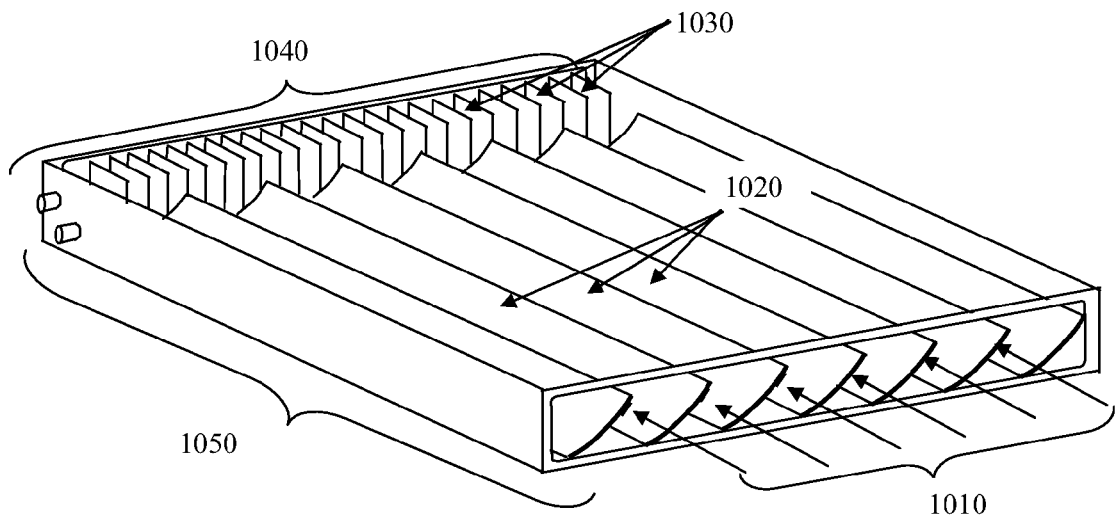
FIG. 1a General drawing of many embodiments, with illustration of PV material location for concentrating and non-concentrating embodiments.
Figure 1B:
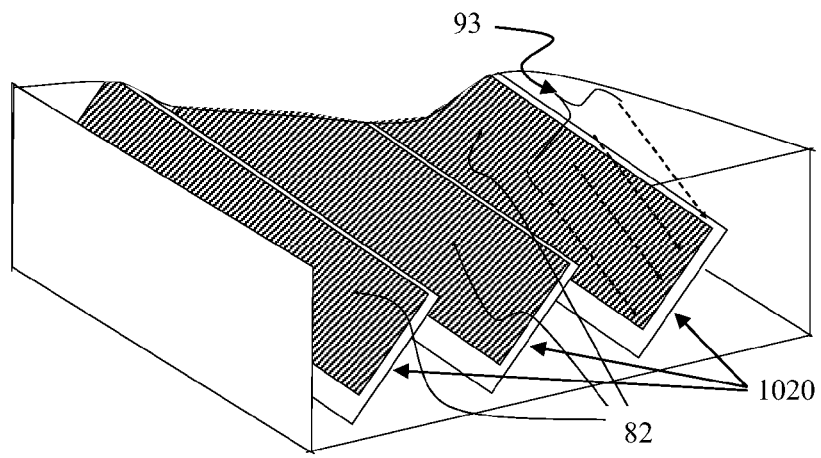
FIG. 1b is a non-concentrating embodiment.
Figure 1C:
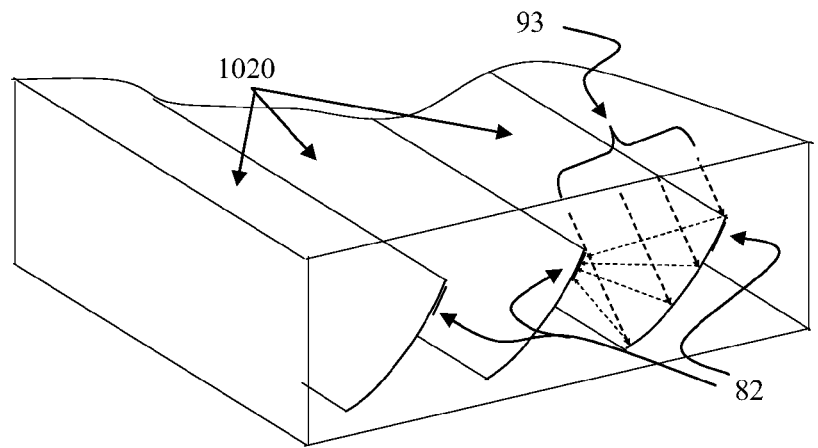
FIG. 1c utilizes a concentrating reflective lens to reduce the PV area.

Embodiments utilize an innovative two-dimensional radiant energy converter ("converter") that is built in a variety of configurations, incorporated into larger structures and controlled in useful ways to lower the cost and increase efficiency of electromagnetic energy (e.g. sunlight) collection and conversion. Broadly speaking, the energy converter comprises coordinately positioned slats that form a face for admitting light that is transparent to electromagnetic energy, such as sunlight. Embodiments of the converter convert radiant energy that pass through the transparent surface into electricity and/or heat in a variety of innovative conformations, based on reflection and/or absorption on slat surfaces within the converter. Energy is removed as heat from the energy converter, and optionally as electricity. The opposite face of the converter may be transparent or may be absorbent, and the converter may control the amount of radiant energy that passes through unabsorbed. In an embodiment, the slats of the converter are designed for a single reflection of radiation onto a target or for absorption.

Desirable packaging configurations of the radiant energy converter allow heat removal into re-circulating fluid or another gas and can be adapted for existing energy systems or incorporated into new buildings. Photovoltaic (PV) surfaces can be placed on the outward facing slats or using the slats a concentrating "lens" to create more electricity per unit area of expensive PV material. Specific designs and methods for adapting the two dimensional radiant energy converter into a building such as a roof, wall, or window are provided that limit environmental exposure compared to conventional designs. Still further, methods are presented for intelligent control and use of the converters to satisfy changing heating, lighting and electrical demands of a building.

The Planar Radiant Energy Converter

Embodiments incorporate one or more converters, each of which comprises multiple slats arranged in Venetian blind fashion so as to form a planar structure that intercepts radiant energy such as microwave energy and light energy. A converter comprises a first front face that permits entry of radiation (e.g. transparent to sunlight) and a second rear face that may be transparent or opaque to the radiation. The faces preferably are parallel to each other but can be generally parallel (off from parallel by up to 30 degrees) or even oblique to each other.

The (generally) parallel faces enclose the slats and typically have closed edges to form an air tight box with flat sides, with slats of equal length lined up in a rectangular area within a box shape converter. The converter preferably is at least 5 times, 8 times, 10 times, 15 times or at least 20 times as wide and as long than it is thick. The thickness preferably is between 5 cm and 100 cm, more preferably between 7 cm and 60 cm, and yet more preferably between 9 cm and 25 cm. In this sense the converter is thought of as a planar energy converter with a defined two dimensional radiant energy input face, which typically is a glass or clear plastic transparent window. The converter may be a stand alone box with (preferably) one set of slats, with (less preferably) more than one set of slats or may be multiple boxes that work together, by sharing common edges, common airflow, and/or by sharing common conduit for transfer of heat energy via a liquid or gas.

In a desirable embodiment the light transmissive window of the converter has a means for removal to clean the cover. The means may be any of a variety of structures, as will be appreciated by an artisan in the window field. The window may have one or (preferably) two or even more pivots to allow pivoting away from a converter box. Clamps may be used to hold the window onto the converter. A pipe, or sprayer of water, air or other liquid may be positioned to wash the window. The entire converter may be tilted and water or other fluid or a gas sprayed onto the window surface, to allow particles to fall away.

In an embodiment the two dimensional converter includes one or more air dams that run parallel to the slats and that inhibit air movement perpendicular to the slat lengths.

Slats for the Energy converters

Slats are analogous to Venetian blinds and may be of any material and size as suited for a situation. Preferably the slats are at least 10 times, more preferably at least 15 times, 20 times or at least 30 times as long as they are wide. In a desirable embodiment the slats are several centimeters wide, preferably 3 to 20 centimeters and more preferably 4-7 centimeters wide, and at least 30 centimeters, preferably at least 50 centimeters and more preferably at least 100 centimeters long. The embodiment that concentrates the sunlight has a concave "front" side of the slats preferably is reflective, and may have a white coating, a polished aluminum coating, or more preferentially, silver-based specular mirror coating or other treatment to reflect the radiation. This surface typically is oriented to catch and reflect radiation that enters the converter. The convex "rear" side of the slats preferably is opaque to the radiation and for example may be black to absorb sunlight. The rear side preferably is covered at least in part by a radiation to electricity transducer, such as a solar cell for sunlight radiation.

The slats may be continuously curved and also may be facetted. The slats may be parabola shaped from one side of their width to the other. In an embodiment the slats are not parabola shaped but employ a progressively curved surface where the radius of curvature continuously increases from edge to edge, for a best reflecting optical surface. Using this design, it was seen that as the sun angle changes, simply rotating the slats as in a Venetian blind by translating the relative positions of each edge with respect to each other can result in a distorted focal. The clean and sharp concentration achieved with the sun at an optimum design angle is no longer a classic focal point in this situation.

Figure 2A:
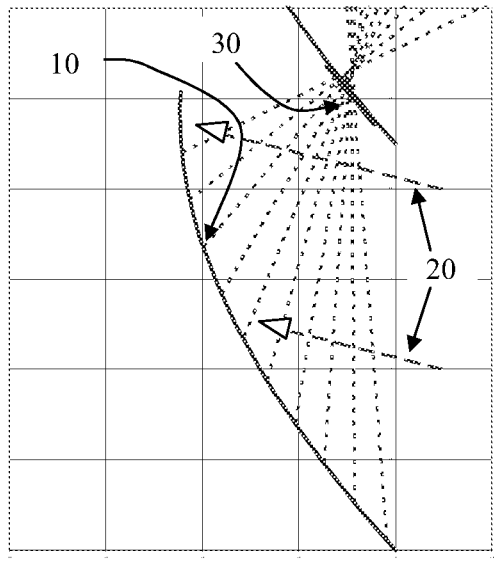
FIG. 2 shows a cross section of solar radiation incidence angles and slat configurations according to a concentrating embodiment. 2a is the design case sun angle at −15 degrees.
FIG. 2b is for the sun at +15 deg with corresponding slat angle adjustment.
FIG. 2c is for 45 deg sun and FIG. 2d is 55 deg sun angles.
Figure 2B:
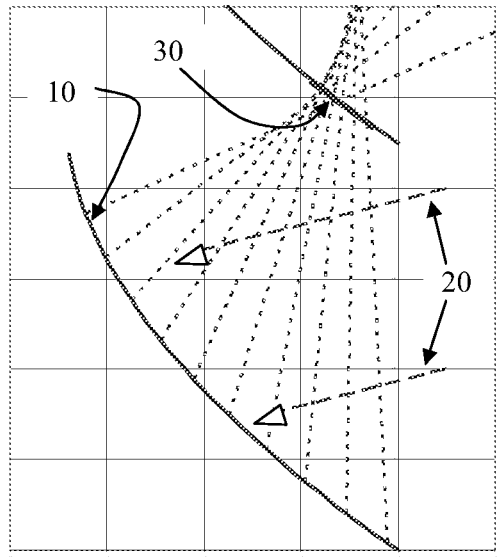
Figure 2C:
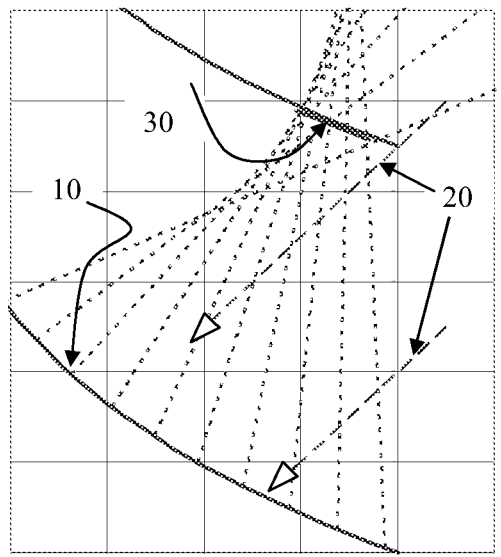
Figure 2D:
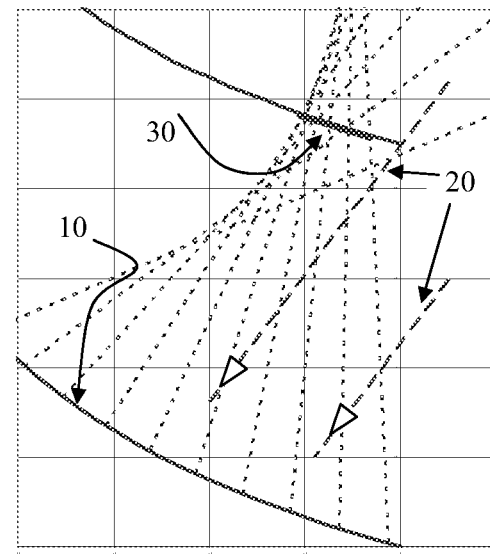

FIGS. 2a-2d show alternative solar radiation incidence angles and slat configurations according to an embodiment illustrating that as the sun direction changes in one direction (away from a vector pointing from the middle of the concave surface to the PV array on the next slat nearby), there are 2 "loss" mechanisms that arise: 1) light never intercepting the reflector and 2) focusing losses. Both of these loss mechanisms can be minimized by adjusting the length of the slat and adjusting the curvature of the slat. FIG. 2d shows solar radiation incidence angles and slat configurations according to an embodiment that illustrates that designing the slat shape for a negative 15 degree sunlight angle still has very good effective capture with the sunlight 70 degrees away from that design angle (+55 degrees).

These drawings show that as sunlight angle changes, the slat angles should be altered such that sunlight hitting the outer most part of the reflector (right edge in this view) is directed at or near the right edge of the solar cell. This design accommodates the defocused optics by using solar cells that cover an area of the rear slat that matches much of the distorted focal line.

Another optional criterion for slat shape is maximization of captured light incident to the slat and control of the amount of light to permit light to pass through the converter. Swiveling the slats for maximum energy capture may be used in this context, as exemplified in U.S. Pat. No. 4,690,335, the contents of which (particularly slat configuration and control), are incorporated by reference for what they teach in this area. In particular, the slat confocal line becomes "distorted" for radiation that is not along a designed-for-direction. Although slat swiveling is used to compensate for much of this distortion, a parabolic shape no longer has a focal line when the orientation of parallel, direct radiation is not from the design angle. Also, the focal line translates and rotates as the slats rotate. However, the combination of wide focal area, such as a solar cell reflection target of at least 10% as large as the reflecting surface, with shorter slats of less than 9 cm width is desired to provide suitable focal areas that can be captured. Often, most distortion occurs from the reflected light off the most interior part of the slat, but one finds that this area is shaded by a nearby slat. The light reflected off of the illuminated section of the mirrored slat may remain relatively in focus Desirable slat orientations are exemplified in FIGS. 2a-2d. These figures show how orientation of the concave surface of the slat can be modified for different radiation angles. Light that enters the converter more parallel to the slat at an off design value is more difficult to capture.

Slats may be formed of any material; although formed sheet metal (particularly aluminum) is preferred (roll forming appears feasible and can be very low cost in high volume). Extrusion also appears feasible. In an embodiment, slats are formed from a plastic that may be further coated with reflective and/or absorbent coating and optionally with electronic material such as a flexible photocell. A challenge with plastic slats is the poor heat conductivity of plastic will not spread the absorbed hear very well in the embodiments with the concentrating optics. The material may be coated to become reflective or absorptive, and preferably has a specular mirror finish, coating, or film to allow reflection of radiation on a smaller, rear absorptive surface of an adjacent slat in the concentrating embodiments.

The slats should be mounted parallel to each other. Their parallel orientation may be maintained by a structure or mechanism as is known in the art. The use of a notched bar of polycarbonate, aluminum, and acrylic or other material that can survive high stagnation temperatures (perhaps 100 deg C. if the air flow stops) particularly is preferred. Transparent materials as linkage/structural support alleviate shadows that can affect electric power generation in the PV material (e.g., such as solar cell or photovoltaic energy converter segment 650.) So if linkage or air dams are used on the outside edge of the slats clear material is preferred, such as polycarbonate and acrylic. U.S. Pat. Nos. 6,988,525; 6,561,251; 6,422,288; 5,687,785; 4,159,707; 4,155,395; 4,356,857; 4,750,539; and 4,143,640 represent some technologies in this area, and specifically are incorporated by reference with respect to structures and mechanisms for slat construction, manufacture and use.

An embodiment provides a lower cost and more convenient to manufacture converter design by virtue of the relatively short focal length from one slat to the other, and consequent relaxed focus target area requirements. The target area preferentially is close to the reflector, which is typically a distance of less than 5 slat widths, preferably less than 3 slat widths, and more preferably within about 2 slat widths. The actual curvature of the slat can vary plus or minus 2%, 5%, 10% or more and the actual distance from slat to slat (focus distance from reflector to absorbing target area) can vary plus or minus 2%, 5%, 10% 20% or more. Thus, the design according to this embodiment provides looser tolerances on the slat shape, linkage spacing, and controller precision compared to other, more expensive alternative solar concentrators. Furthermore, the spacing mechanism for holding slats apart is small enough to allow inexpensive machining, punching, and notching in a single component with conventional shop equipment, which saves costs and aids in manufacturing precision.

Slats are assembled into a two dimensional array as is known in the art for Venetian blind type of structures. Preferably however, a design is used that minimizes shadows from structures or linkages. Accordingly, slats should be coordinately linked via clear plastic or thin metal linkages. Preferably wire is used for coordinate linkage and control, to minimize shadow interference. If a thin metal linkage is used, preferably the band has a thinness that is no more than twice the thickness of a slat, and preferably no more than the thickness of a slat. In a desirable embodiment one end of each slat is attached to a fixed immovable support. Preferably this support is on the side away from incoming radiation, and may be the rear face.

A slat support or spacing feature desirably is fixed to the collector back or the collector box walls. The outside (toward the sun) edges of the slats preferably are linked together and are translated by a top linkage, which could be implemented various ways. In selecting a linker, it is preferred to minimize the linker casting a shadow on the reflecting slat. Therefore small dimension linkers such as heavy rigid wire or the use of clear plastic such as polycarbonate are preferred.

Figure 3A:
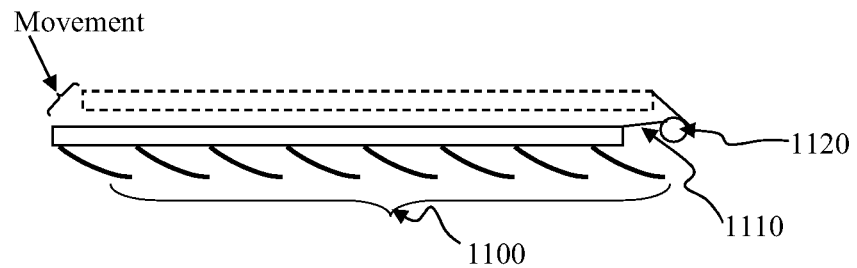
FIG. 3 shows embodiments of a slat movement mechanism using top linkage bars. 3a is uses a steel rule tape. 3b uses a cammed-rack & pinion. 3c uses a cable loop.
Figure 3B:
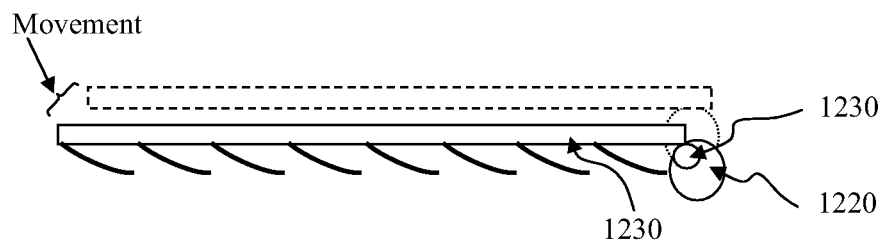
Figure 3C:
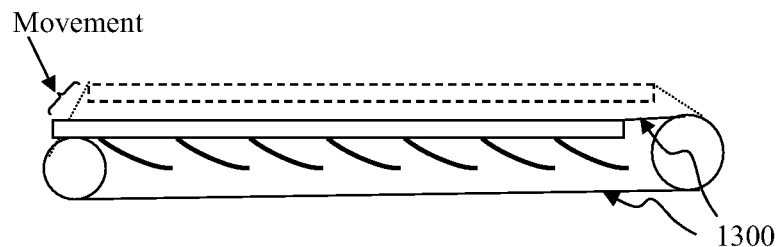

The linker spacing and connection to the slat can be selected from a variety of mechanical attachments, as will be apprehended by a skilled artisan. A clear solid connector of the slats that coordinately swivels the slats can be punched or machined with precision features. A rigid wire connection between slats preferably uses notches or clips on the wire to set those positions on each slat. The motion of the top space/connector is back and forth as is apparent from the motion of the slat edges, and also changes in height in the enclosure. Thus a variety of mechanisms may be used to interconnect the top to an actuator and several are shown in FIGS. 3a-3c. The dashed rectangles in the figures represent the linker bar in the "up" or "in" position. As such the figures represent the linker bar in two positions for each option.

One interconnect method is to tie the linkage part to a shaft or cam using a curved sheet metal tape. Such curved metal tapes are known and used in tape measures. For example, a skilled artisan will appreciate the use of materials and methods for "power tape" technology that may be adapted for rolling up slats in the present embodiment. See for example U.S. Pat. Nos. 3,036,791; 6,931,734; 7,020,978; 6,223,443 and 6,470,589 the contents of which and particularly details for reversibly extensible tape structures are incorporated in their entireties. Most desirably, the material should be flexible and lightweight with high tensile strength, be flexible, but also carry a modest compression load over short distances such that shaft and tape can "push" on the linkage. A cam is not required to allow the linkage part to rise and fall as it is translated back and forth. That is, the tape can flex a bit if necessary although with substantially reduced ability to carry compression loads.

FIG. 3a shows an embodiment of slats 1100 with connected curved sheet metal tape 1110 tied to shaft or cam 1120, similar to that used in tape measures. This is flexible and lightweight but with high tensile strength. The tape can both pull and push on the linkages. A cam is not required to allow the linkage part to rise and fall as the linkage translates back and forth. The tape can flex some, in an embodiment.

A second embodiment shown in FIG. 3b depicts a bar 1200 that coordinately moves the slats and is attached via a cammed rack and pinion gear. The rack 1210 and cammed-pinion 1220 and a geared pinion are on a shaft 1230 connected to motor (not shown). In a third embodiment shown in FIG. 3c, flexible wire 1300 is wrapped around the assembly so the wire can pull on either end of linkage bar 1300.

Figure 4A:
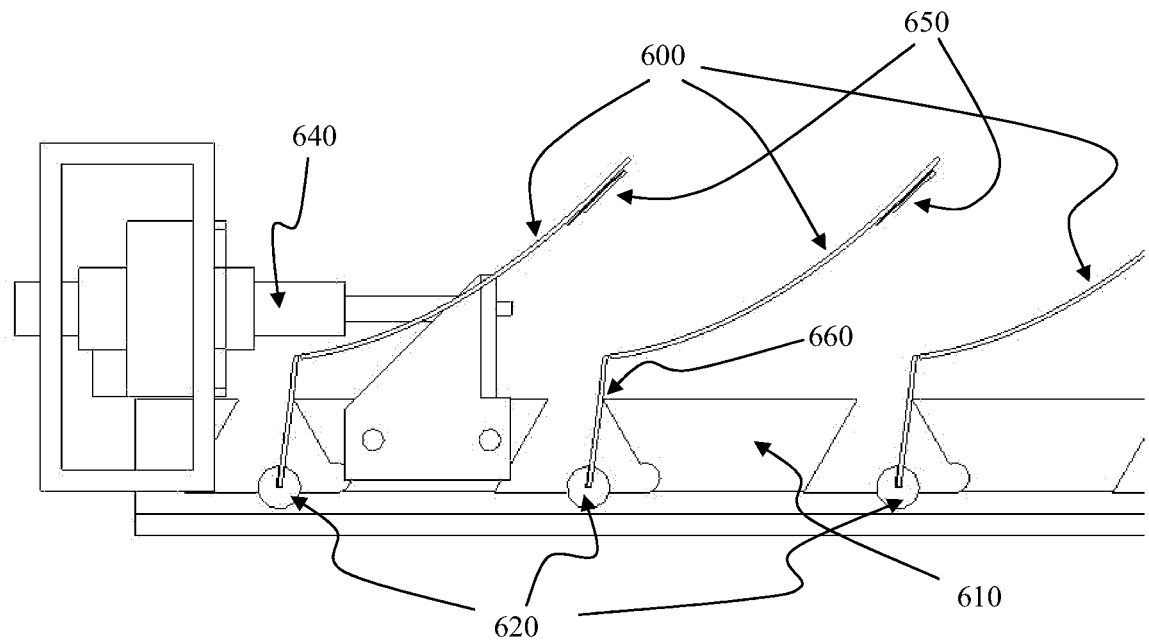
FIG. 4a is a front view showing the slat flanges with pivots, support bars, actuation bar and drive motor.
Figure 4A:
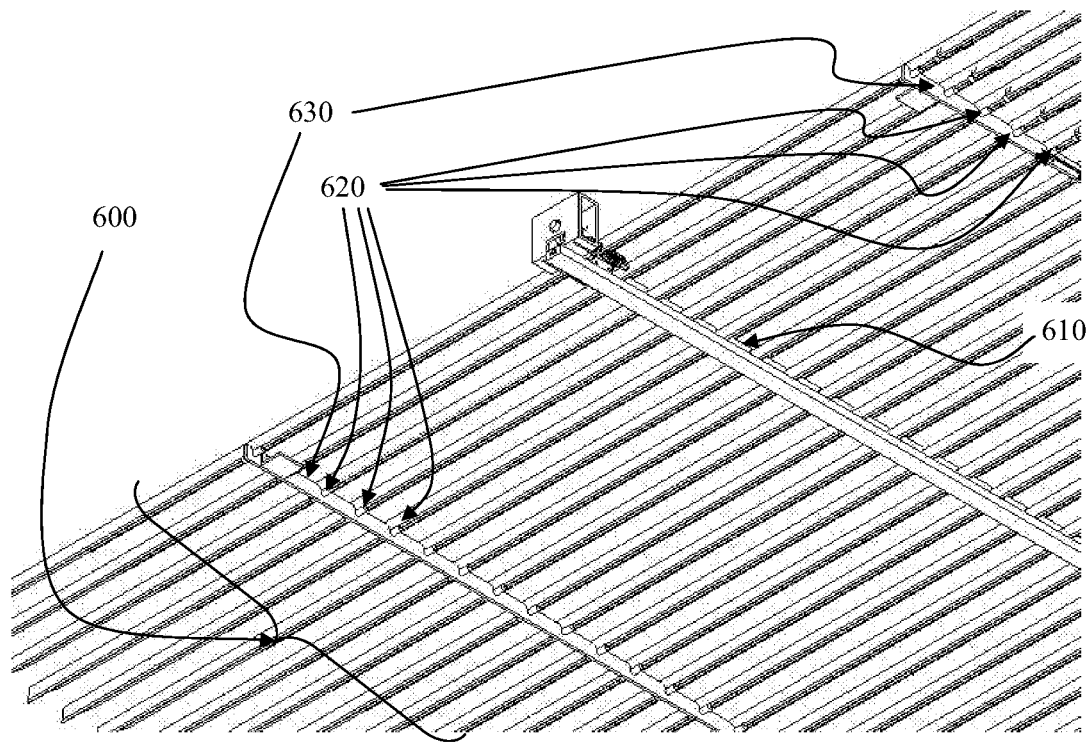

A variety of interconnect methods are contemplated. Of these, a wire is preferred for having a smaller optical profile that casts a smaller shadow on the PV cells. A wire would run Venetian blind style perpendicular across the slats and can be attached by materials and methods known to the skilled artisan. FIGS. 4a and 4b illustrate an embodiment where the slat rotation is effected completely from the inboard edge of the slat—avoiding shadowing issues and pragmatic challenges on of bending stiffness needed from the linker bars in the embodiments in FIGS. 3a-3c. The slat (600) has a flange bent or extruded as part of the same piece that has the optical surface and PV mounting or photovoltaic energy converter 650. The actuation bar (610) translates left and right in FIG. 4a pushing on the flange.

Pivots on the end of the flange (620) translationally restrain the slat end converted the interfering motion of 610 into rotation of slat 600. The pivots are secured in a punched or machined support bar (630) that are mounted to the converter frame and/or backing. A linear actuator (640) is shown that precisely moves the actuation bar. The PV material (650) is shown on the back side of the slats. A representative contact between the slat and the actuation bar is shown as 660.

The interconnected slats acquire heat energy by, for example, direct absorption, or indirect transfer via thermal conductivity of heat from solar cells. This heat may be transferred out of the converter by convective transfer via air flow parallel to the slats. Unlike the previous techniques such as described in U.S. Pat. No. 4,577,619, (the contents of which and especially mechanical details for slat construction and movement, are incorporated by reference specifically) preferably air flow is not across the slat width but instead along the long axis, which provides greater heat transfer and less slat flutter.

In most embodiments this air movement is forced by a fan. Forced convection is preferred because generating flow parallel to slats is important for several reasons. This allows higher volumetric flow rates which are important to transport the heat out of the box, for air has a low density and limited specific heat. Transporting reasonable amounts of heat without the efficiency robbing high air temperatures requires flow rates that would be difficult to achieve if the flow is transverse to the slats. Also, good convective heat transfer between the flowing air and the slat requires reasonable velocities right next to the slat. That would be difficult to achieve with flow perpendicular to the slat's long axis. The flow would bypass most of the slat's surface. Analysis of the flow conditions, factoring in parasitic losses for the fan to offset the frictional losses in the flow passages and heat exchangers it appear that flow rates of 200 to 350 m3/hr per square meter of aperture between heat exchangers (which removes heat from the air) yielding temperature rise to about 4-8 deg C. per collector. This results in flow velocities, when the entire area of the cavity can be used (parallel flow to the slats) of 1.5 to 3 mps. Experimental results show that for flow speeds much over 3 mps can induce undesirable flutter in inexpensive, lightweight slats. Attempting to flow similar amounts of air transverse to the slats, as taught in some prior art would likely lower the acceptable speed that induces flutter substantially. Also, even these modest average flow speeds would be much less between the slats than the average flow that is going around the edges of the slat in the non-parallel flow approach. This could be partially mitigated with deeper cavities to let the flow go around the slats, but most importantly the low flow speed on most of the slat surface area reduces the convective heat transfer between them—substantially increasing the temperature difference between them which impacts PV performance and reduces thermal efficiency. Engineering estimates indicate that the temperature difference between the slat and the air in non-parallel flow would be 2.5-6 times higher than for parallel flow—impacting PV efficiency 10-20% loss and thermal efficiency 15-40%.

Figure 5A:
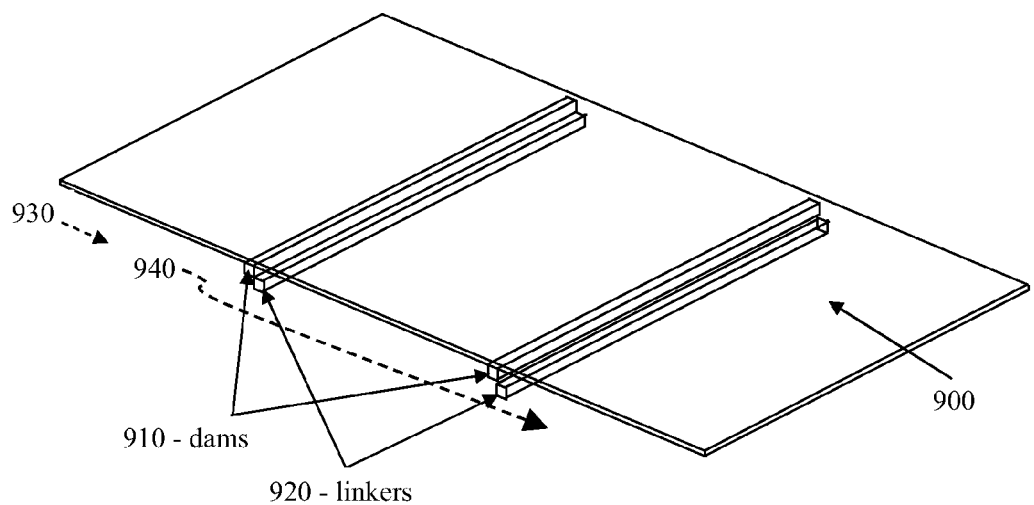
FIG. 5a isometric view shows representative air dams within a converter.
Figure 5B:
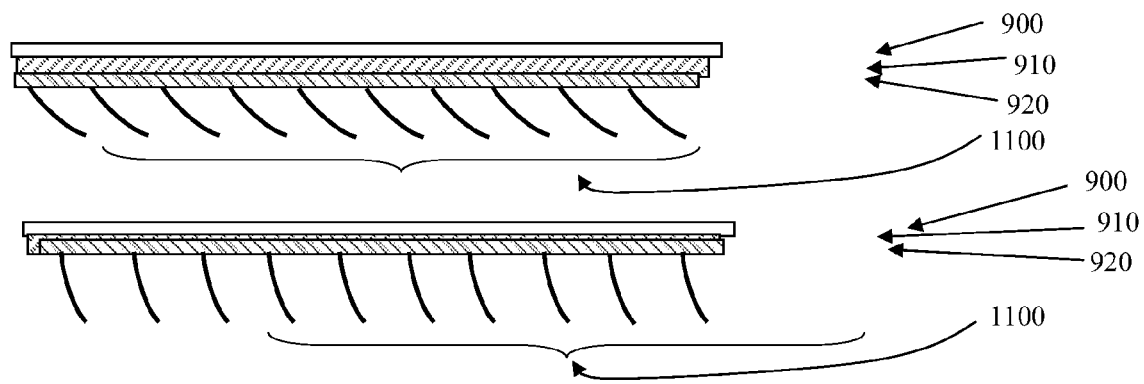
FIG. 5b is a partial front view showing how the linker bar extends the air dam effect when the slats are less normal to the cover.

In an embodiment, a slat support on each edge of the slats creates an air-dam to reduce convective loss to the cover and back and also increase the flow of air along the heated slats and thereby improve heat transfer. FIG. 5a depicts a representative air dam, and shows rear face 900 with fixed dams 910 attached, the linker bars or moving dams (920) to limit air flow 930 into path 940—away from the transmissive cover to reduce heat losses and closer to the slats 1100 to improve heat transfer.

In an embodiment, air flow along the length of slats absorbs heat from the slats and then gives up the heat at a heat exchanger at the edges of the slats, as exemplified in FIG. 1a. That shows air flow 1010 along slats 1020 that encounters fins 1030 of heat exchanger 1040 at one side of converter 1050. A heat exchanger can use a secondary fluid or gas to carry away heat and may be shared among two or more converters.

Figure 6:
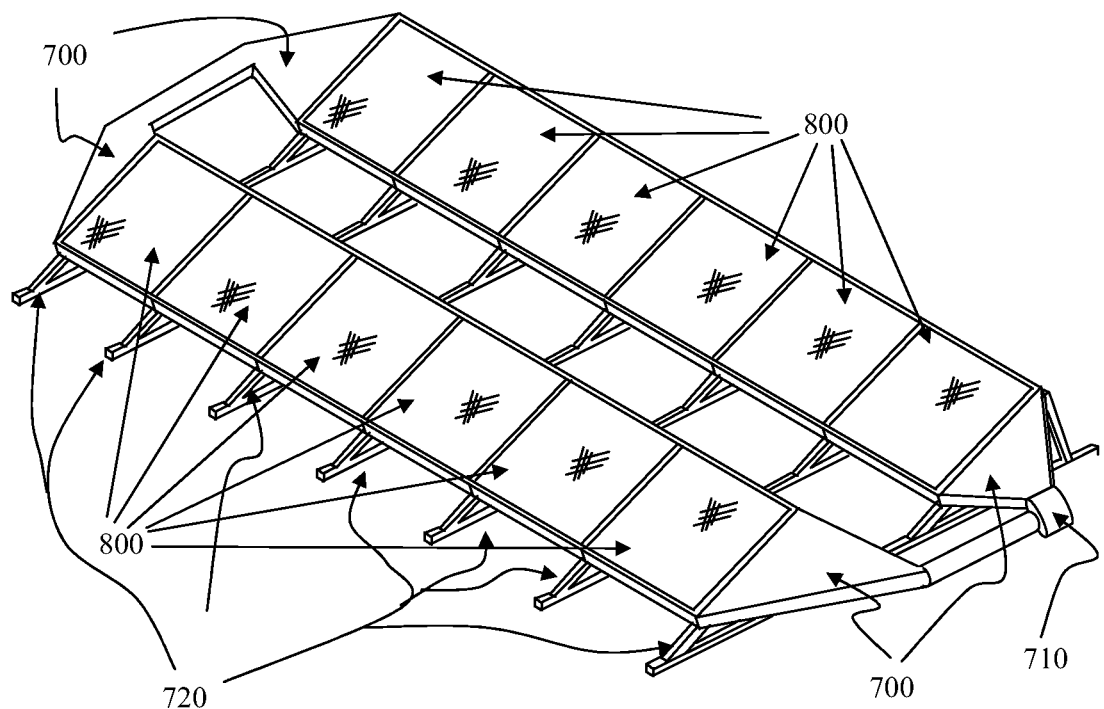
FIG. 6 shows two rows of converters with manifolds to share a common closed loop air circulation system.

An array of slats can be bundled together within a converter, and heat from the converter can be removed by forced air or a secondary heat exchanger. Alternatively, two or more converters can be arranged end to end such that the ends come together as shown in FIG. 6. Further, the air loop can utilize a nearby row of converters as part of the air circuit, reducing the cost and space needed for a separate parallel air duct near the row of converters. Shown are 2 rows of 6 converters (800), air manifolds at the ends of the rows (700), a fan or blower (710) and mounting frames (720). In an embodiment, a manufacturing technique provides a low cost method for quickly and effectively mating the converters to each other.

Figure 11A:
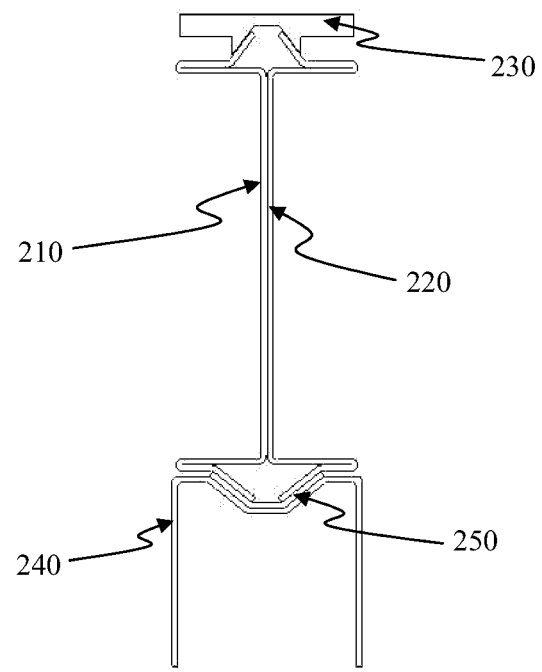
FIG. 11a shows converter to converter clamping mate/mount technique in a section view.
Figure 11B:
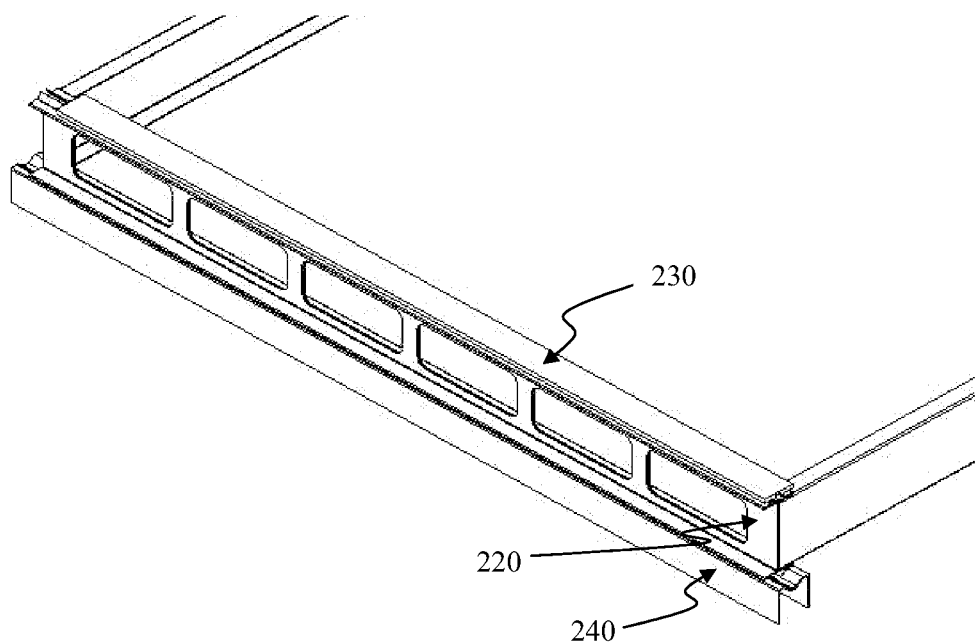
FIG. 11b shows an isometric view of part of such a connection.

A section view of representative clamping/mating geometry is shown in FIG. 11a. This shows the right end of the left box (210), the left end of the right box (220), a clamp (230) that, when restrained, couples the boxes together and secures 210 and 220 in the support bar (240). Ridged features are used on the top and bottom of the box edges to provide a surface for the clamp and support bar to grip. The versions of 210 and 220 are bent sheet metal. There are other ways to bend the sheet to get a functionally similar box end. Extrusion is another feasible option for all of all these parts. A gasket (250) between the box ends and the support bar seals the air envelope flowing in the converters and provides a bit of thermal insulation between the warm boxes and the uninsulated support frames. FIG. 11b is an isometric view of the "right" box, the clamp and support bar.

Although most embodiments utilize air movement along the slats to extract heat energy, direct transfer of slat heat to another material such as a solid or liquid, by thermal contact also is possible. In an embodiment air flows up through the slats instead of along the slat lengths. In yet another embodiment flow is controlled (with optional manifolds) under and over the slats and transverse to the flat surfaces. This latter embodiment may require more height or depth to the converter. This technique also may place large flows near the cover and back surfaces that tend to increase heat losses from the collector. Optionally, a heat exchanger is located at the back side.

Solar Electric Conversion

An embodiment provides lower cost electrical energy conversion by focusing light from the concave curved fronts of slats onto smaller photoelectric (i.e. radiation to electricity converting) regions on the convex rear surfaces of adjacent slats such as solar cells. Desirably the focus ratio (light reflection area of concave front portion divided by the solar cell area located on the rear of the adjacent slat) is between 2 to 50, and more preferably between 4 to 10. FIG. 2a shows an optical layout of a representative concentrating slat design. Two slats are shown in each section, with sunlight and slat angles changes. In the top left side of this figure shows the design sunlight and slat angle, sunlight (in long dashed lines) shines at a negative 15 degree azimuth to the left side and reflects off concave slat surfaces (10) as dotted lines (20) into solar cells (30) according to a design angle. Solar cells (30) are located on a rear portion of each slat onto which light is focused. FIG. 2d shows that slat adjustment to accommodate sunlight shining from a 55 degree azimuth allows focus onto the same solar cell area despite changes in azimuth.

Figure 7A:
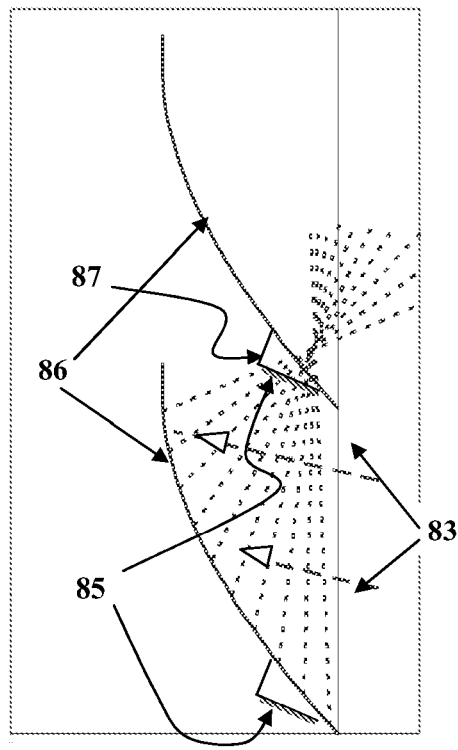
FIG. 7a shows alternative solar cell placement with a raised area on the back side of the slat.
Figure 7B:
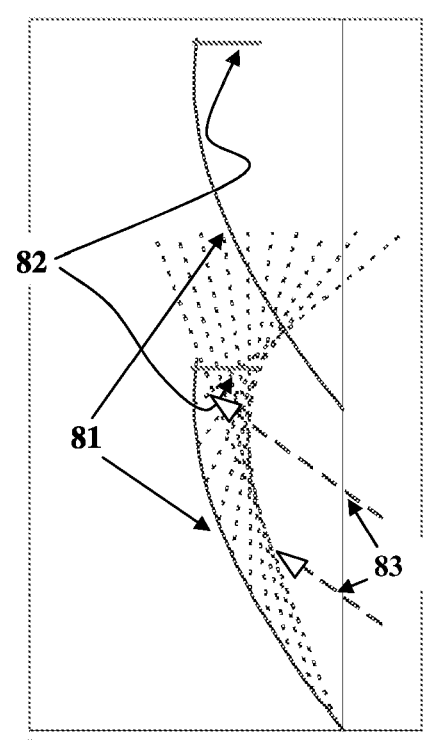
FIG. 7b shows a PV cell location on a flange off the inboard edge of the slat.

The solar cell (or other radiation to electricity conversion device) in an embodiment is placed on another part of the slat, or off the slat. See, for example, FIG. 7b, which shows slat reflector surface 81 with attached solar cell 82 substantially perpendicular to the reflective surface. Other angles are intended for other embodiments, but are not shown here. As shown in FIG. 7a, light rays 83 impinging on reflector 81 are directed onto the adjacent surface of attached solar cell 82. In an embodiment, the solar cell is on a tab at the inboard end of a reflecting slat. The left side of FIG. 7 shows two slats 86 with solar cells 85 on their rear surfaces but spaced off via hat structure 87.

Figure 8:
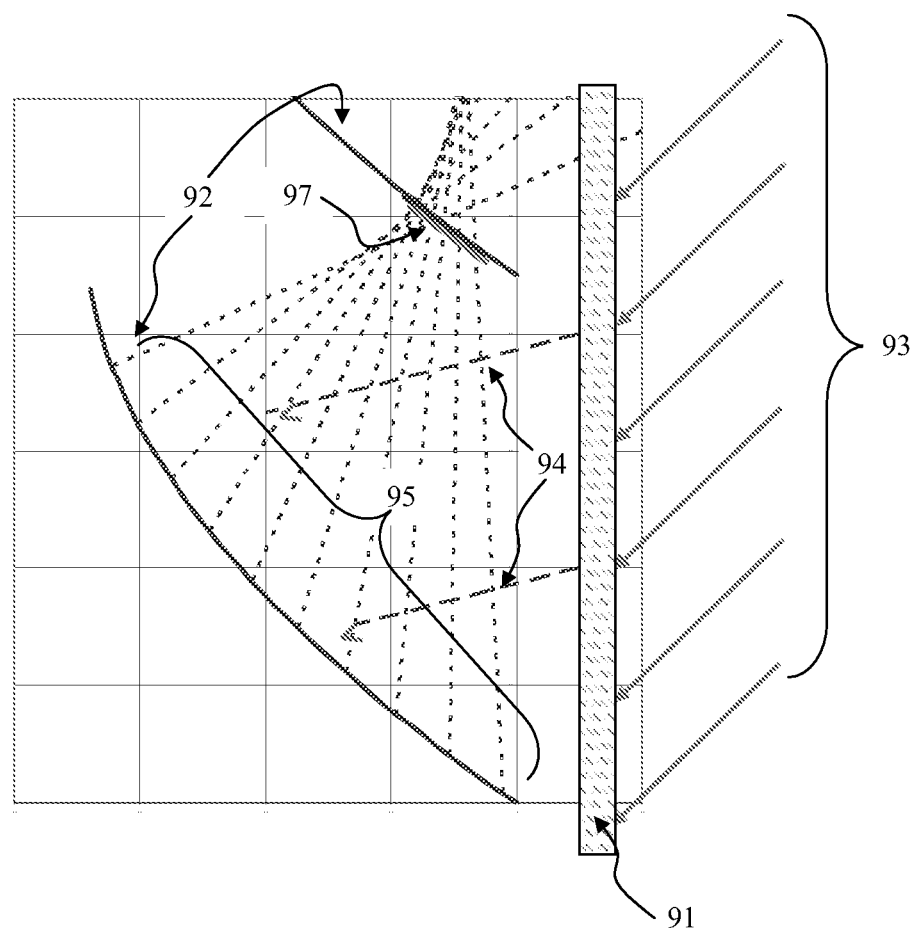
FIG. 8 shows an alternative combination of reflecting slats with refracting lens on outboard of the reflecting slats, according to an embodiment.

Light may be concentrated by a combination of reflection and refraction, as exemplified in FIG. 8. This figure shows refracting lens positioned outboard of reflecting slats 92. Direct light rays 93 impinge on the refracting lens, which refracts the light into altered paths 94 and onto reflecting surfaces 92, which then reflects into paths 95, which more effectively focuses the rays onto solar cell target 97. In an embodiment, this "hybrid optics" scheme, which uses refraction and reflection in series may employ a continuous or Fresnel lens, or even facetted refracting for each slat opening. This lens could be a top cover over the curved reflectors. The refractor can pre-bend some of the light, which changes the required shape of the reflectors and may reduce the slat rotation motion required. For example, a Fresnel cover may be added. The hybrid can alleviate the light leakage problem when the sun angle departs from the design angle. Also, not shown, the refracting aspect can have light exiting that is already starting to focus, vs. the example in the FIG. 8 where it is simply deflected, but light rays remain parallel to each other after exiting. This would allow the use of flatter or more curved reflective lenses should that be beneficial.

Cost reduction occurs from concentrating sunlight onto smaller solar cell surface areas, and by using materials (reflective slats) that are cheaper per surface area unit than semiconductors for light scattering. In a preferred embodiment the slats are stamped sheet metal, and preferably are aluminum. By using slats, the force needed to move optical surfaces (slats) is very small compared to that needed for many previous systems of comparatively large collector areas. In a preferred embodiment, short optical paths of approximately 5 cm (i.e. 2-25 cm, preferably 3-10 cm, more preferably 4-8 cm) are used, along with moderately low concentration ratios of about 3 to 10. These dimensions provide looser manufacturing and tracking precision tolerances compared with that needed previously for systems having longer paths and higher concentration ratios. Cost savings thus exist in manufacturing the solar collector surfaces, the system to hold the surfaces at their proper spacing, and in the simpler tracking system needed to obtain good efficiencies.

Solar cells (e.g., 30 or PV segments 650) in an embodiment are attached directly to thermally conductive metal slats to facilitate heat transfer from the solar cells to the slats. Thermally conductive epoxy that includes thermally conductive filler such as boron nitride may be used. In an embodiment, electrically and thermally conductive epoxy such as silver filled, aluminum filled, or bromine intercalated graphite filled epoxy is used to both electrically and thermally connect a back surface of a solar cell onto a metal slat filler. A second electrical and mechanical connection to each solar cell may be made on a top surface or edge via wire that may connect to a metal linkage, or run along a linkage such as a mechanical linkage that holds the slats together or that pivots them together.

An embodiment provides non-symmetric curved reflectors that concentrate light efficiently at various radiant energy angles onto a target solar cell surface. For example, when the radiation vector becomes more parallel to the slats, a lower percentage of the radiation becomes captured. In some cases such radiation passes through the converter as desired illumination, potentially reducing electrical lighting needs. Such features may be exploited as a window treatment wherein direct light heat gain and glare may be controlled along with electrical power generation and even thermal power generation. Other applications include use as a skylight without the problematic heat gain and glare for occupants conventional skylights often have, while also creating an outdoor feel to a building interior when the sky can be seen undistorted by translucent coverings that otherwise may be used to correct heat gain and glare.

In an embodiment, one axis tracking is used to orient reflecting concentrators. This can create shadows and possibly radiation leakage near the ends of the photoelectric arrays, such as when the sun is substantially non-normal to the array in the non-tracked axis. These imperfections can be alleviated by omitting solar cells at slat edges and/or by the accepted practice of adding bypass diodes to one or more solar cells so that shadowing does not substantially diminish the electrical output from radiation to an electric power circuit.

Lengthwise Air Flow in the Converter

As described, the converter has an array of slats with slats parallel to each other and coordinately controlled to swivel with a linkage. Air that circulates along the slat length may be used directly for heating by forming a circuit with air in a building. In this case a fan may be placed anywhere in the circuit to force recirculation of air that becomes heated by contact with slat surface and then enters the building to dissipate that heat. Alternately, heated air from contact with slats may transfer heat energy to a fluid via a heat exchanger that may be packaged within the radiant energy converter, located adjacent to the converter and optionally in combination with a group of converters, or located a distance away through which the air travels.

A converter may comprise two large area faces, sides (typically 4 sides if rectangular shaped,) one (preferably) or more arrays of slats that are mechanically coupled to at least one face, and preferably air inlets and outlets for circulating air along the slat length. Air dams help ensure air flow along slat length and may be positioned within an energy converter package via attachment to either face but preferably to a face opposite the transparent radiation entry face as shown in FIG. 5a. The one or more dams are oriented perpendicular to the slat lengths to keep the flow near the slats and generally less on the inside of the transmissive cover. A face should be removable to allow cleaning of the slats or other parts inside the converter. To allow easy cleaning, and associated cover removal the size of the converter area is preferably less than 2.5 square meters.

In one conformational embodiment, the converter is packaged within a chamber to allow heat removal from the slats via lateral air movement along the long axis of the slats. Air movement lengthwise creates less turbulence and more efficiently transfers heat from the slat to the air compared to air movement crosswise. Solar cells mounted directly onto the slats preferably are flat, or even curved and either mechanically contact a thermally conductive (e.g. metallic) slat surface or are bonded via an intermediary conductive adhesive or fastener. Photocells that cover about 8-20 percent of the rear slat surface were found to transfer adequate heat to aluminum slat surfaces and are preferred.

Because of the need for substantial volumes of air to carry heat away due to air's low density and lower specific heat capacity, a large "passageway" for the air is preferred. Accordingly, in an embodiment most (at least 50%, 60%, 75% or more) of the converter package depth acts as the collector, to allow large flow rates. In another embodiment the radiation is particularly at a high energy level such as direct overhead sunlight or microwave energy that can warp or melt components of the converter in the absence of the heat transfer out of the converter. In this embodiment, a fluid may be used in place of gas to conduct heat away from the slats. The latter technique may be used, for example in microwave to electric energy conversion systems.

Powerskins: Converters Incorporated into Buildings

When incorporated into a building a converter acts as an exterior layer and provides some exterior protection. In this context, the converter may become part of the building, either added to an existing structure, or incorporated into a new structure and is termed a "powerskin," A converter that is intended for installation as a powerskin may be advertised, sold and/or packaged with installation instructions, with one or more sensors and/or with one or more effectors suitable for use in an integrated building system. Such converter that is accompanied by an instruction manual or by one or more system sensors/effectors is intended for powerskin use and said to be an uninstalled powerskin. A converter that has one or more electrical connections for sensory or effector signals to a controller thus is termed a "powerskin" by virtue of having one or more input/output connections that allow use of the converter as part of a larger building energy system.

As a powerskin, a converter may provide insulation and can control the amount and type of energy that enters from sunlight or other radiant energy into the building. The powerskin has an exterior face or "cover" to the weather and an interior face to the building, or building interior. The cover in this embodiment acts as a weather guard for the converter and the building. The cover may minimize reflectance and absorption losses of the sunlight passing through the converter and provides an enclosure for the heated air to keep the heated air separate from the external air.

A variety of characteristic features may be modified that trade off the cost of a powerskin, the powerskin's insulating performance and visible light transmission through the powerskin. The back face of the converter can be transparent (for daylighting applications) or opaque which affords better insulation options and lower cost. In a preferred embodiment a multi-wall plastic/polycarbonate back wall provides a lightweight, structurally robust barrier with superior insulation than glass, although glass generally is more transparent and often less expensive. The converter back optionally supports the bottom slat spacers.

Glass glazing may be used in combination with a powerskin to form a very robust structure to resist weather. Because the powerskin optics are within a box and protected, wind loads do not affect optics actuation. Other optical concentrators are exposed to wind forces on their tracking actuators, which incurs greater installation and maintenance costs.

Vertical Powerskin Walls

Figure 9:
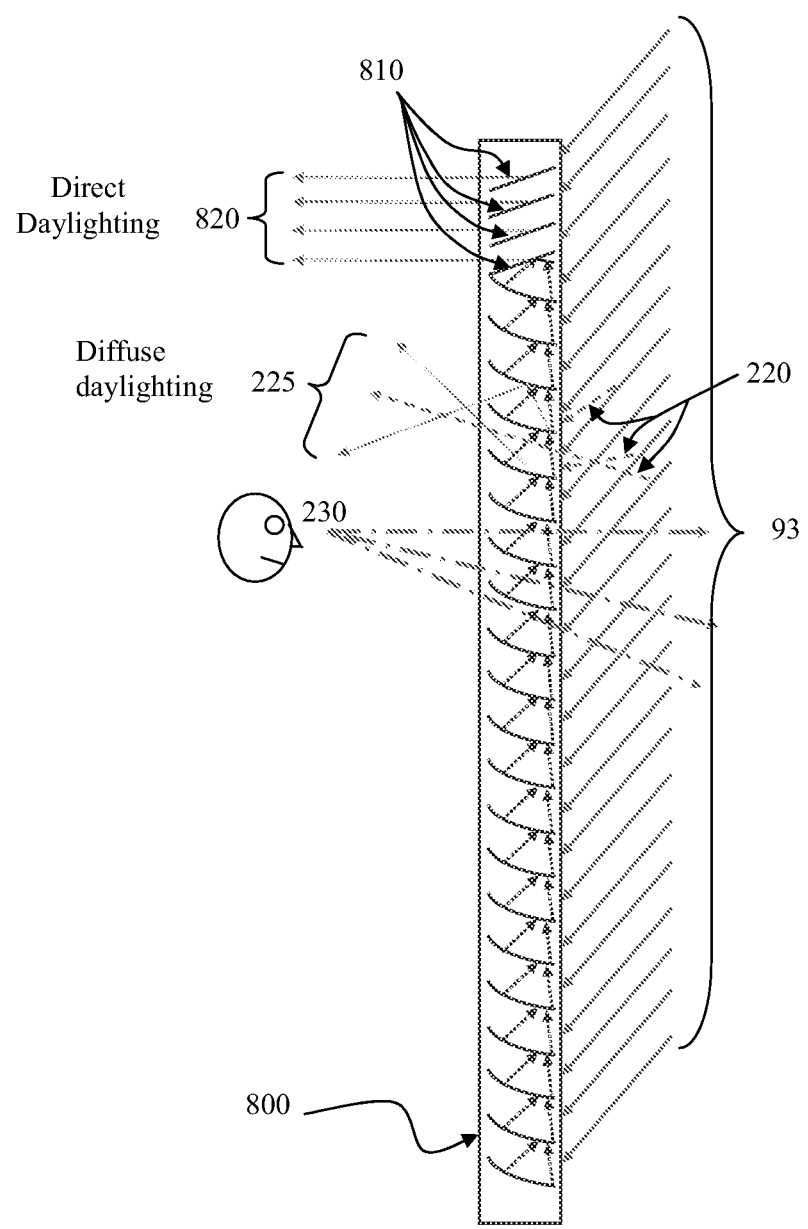
FIG. 9 shows solar radiation transit paths through a vertical converter utilizing planar slats at the top to reflect direct sunlight parallel to a ceiling for enhanced lighting enhancement.
Figure 10A:
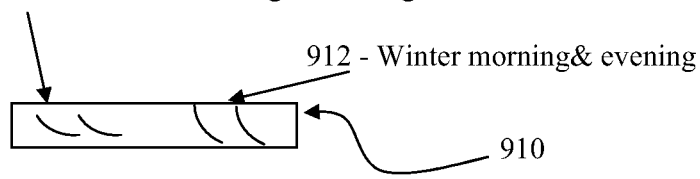
FIG. 10a shows a horizontal converter; 10b shows a shallow converter angle, 10c a steeper inclination and 10d is a vertical installation.
Figure 10B:
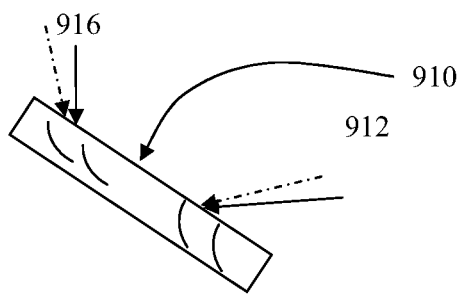
FIG. 10 shows desirable alternative mounting and slat positioning for different converter orientations.
Figure 10C:
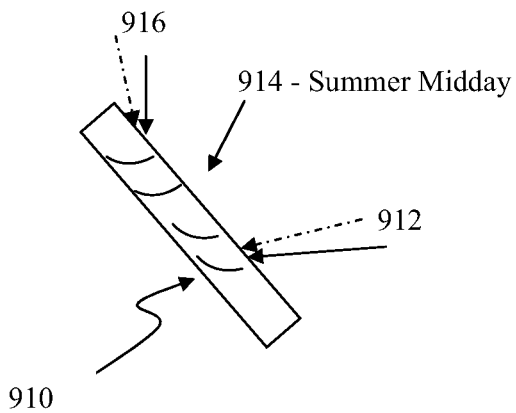
Figure 10D:
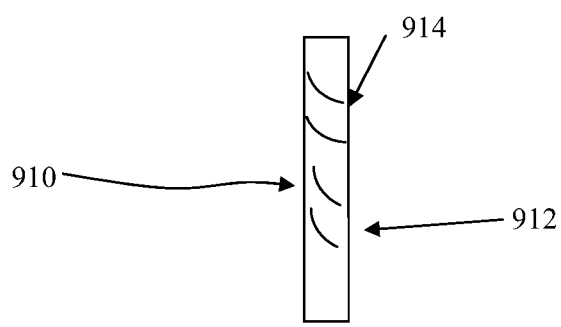

A daylight powerskin embodiment shown in FIG. 9 illustrates how high intensity sunlight may be controlled to avoid glare near the window and direct light deeper into the building. Wall unit 800 comprises upper 4 slats 810 that are controlled to allow direct day lighting (820), while the lower slats are oriented to generate electricity using PV material and also allowing diffuse light, non-direct light (220) to enter the space behind the converter as diffuse daylight (225) behind the converter. Meanwhile, in an embodiment, occupants can see out the window as for regular Venetian blinds as shown by arrows 230. Electricity can be generated at focal point of slat reflections or by applying PV to the exterior of the slats using the direct sunlight (93).

Tracking motion required for simultaneous solar electric generation in this embodiment uses the same slat movements. The angle of such "daylighting" slats can be adjusted with respect to the angle of electric conversion concentrating slats to allow entry of direct daylight to the ceiling, or down toward the floor. The slats may have a variety of curvatures that provide a spreading pattern, as can be determined by a skilled engineer.

Horizontal Powerskin (Roof)

A roof powerskin offers dramatic architectural possibilities without the classic challenges of direct light on overhead apertures. A powerskin when designed into construction, or as part of a major roofing overhaul can eliminate the expense of other roofing materials. Glass used in the outside face of a powerskin is extremely long lived and water-tight, which nearly can eliminate the cost of periodic replacement of lower cost weather-proofing for the roof. The powerskin can assume the covering of a skylight or other fundamental architectural feature of a building. This provides control of light and, in some circumstances extra heat gain in the summer, and insulation loss in severe climate conditions. Thus, a roof powerskin can convert problematic direct sunlight into useful energy forms.

Powerskin Slat Design and Orientation

Desirably, the roof powerskin is a fixed box design in a roof-top mount, and for this example assumed to be in the northern hemisphere and pointed south. The box may be installed with a tilt to fit the architecture of the building/building site and/or to optimize solar energy collection at different times of day or season. The orientation of the concave surface of the slat can vary such that when the slats are oriented most normal to the cover the concave surface can be facing the "top" or the bottom of the converter. The ideal orientation can vary depending on which values (electricity, heat, lighting) are desired at what times of day and season. The most typical orientations are shown in FIGS. 10a-10d where the slope of the collector is the primary variable. If the installation is more vertical, the concave surface prefers to point "up". For horizontal installations the concave surface want to point to the South (or down, if there is some slope to the converter). Converters can be installed facing in any azimuth and a skilled artisan will be able to recognize the preferential slat orientation given the site specifics.

The range of angles for incoming light rays that strike the collector varies with the installation orientation. Vertically oriented collector 910 of FIG. 10d receives sun rays that vary from directly overhead to parallel to the horizon. Sun positions for this cross sectional plane vary by at most 90 degrees. The amount of radiant energy at either extreme is low because when normal to the collector the sun is nearly at the horizon, with atmospheric attenuation. In this case, the light and the duration of the sunlight in this orientation is short. If this design is used in a collector design mounted more horizontally, the sun angle can actually be in a wider range. Arrow 912 shows radiation orientation for winter morning and evening. Arrow 914 shows summer midday, and arrow 916 shows radiation orientation for summer morning and evening.

Preferably these collectors are installed in an east-west axis and have a tracking axis that follows declination of the sun. Near the summer or winter solstices this declination will vary substantially throughout the day, and the angles differ greatly in the mornings and evenings from summer to winter. Such configurations desirably can use sunlight variations of approximately 130 degrees or even more for summer mornings where the sun rises north of east in the northern hemisphere and a horizontal east to west axis array would need to point directly north at dawn and directly south for winter dawn and dusk. The practical amount of light in these transitory periods is small. Accordingly, optimized performance for more common orientations results in more net power collected per year.

The collector optionally may be tilted towards the equator or south in the northern hemisphere, which reduces the southern most extreme because the southern horizon is no longer 90 degrees from normal. Thus leaves the northern horizon further from normal. Each of these installations can employ powerskins as described herein and, in combination with a building structure, is intended also as an installed embodiment.

Additional light reflects outside the selected focal zone. Accordingly, a more negative design sun angle is preferred for non vertical embodiments. In another embodiment, a vertical collector uses between +5 and +35 degrees, more preferably between +10 and +20 degrees, and yet more preferably approximately (i.e. plus or minus 10% of the value)+15 degrees where the sun angle cannot go below zero. A horizontal collector such as a roof top collector preferably is positioned between −5 to −35 degrees, more preferably between −10 and −20 degrees and yet more preferably approximately −15 degrees. These designs were found to provide good performance for most of the year in common installation applications. Installed powerskin embodiments with these orientations are contemplated as well.

The linear nature of reflecting optics as preferred, allows a single axis design wherein light incidence variations in the non-tracked axis can vary significantly without changing the focal line in the tracked axis. That is, as radiation incidence angle moves across a non-tracked axis, the light shifts in an out of the plane in this view, but the concentrated light area remains. Advantageously, this design allows the use of a true single axis tracking system that does not require tilting. Of course, cosine losses occur with declination changes throughout the year, but the described system dramatically reduces wind loads on the system and tremendously simplifies the tracking mechanism. In an embodiment, the system is tilted as well to change the angle of incoming sun ray hitting the aperture for a specific time of the year.

It was discovered that for a flat roof surface, greater efficiency of light energy capture is possible by tilting the panels modestly (typically less than 20 degrees) to improve the incidence angle to the external glazing, and thereby reduce glazing reflection losses. In this latter embodiment individual boxed units of the energy converter can be installed to allow access between the rows for installation and servicing. In embodiments the gap size may be between 6-12 inches, 12-18 inches and more preferably between 18-36 inches. Minimum annual energy collection is lost because the tilted panel intercepts the light that would have otherwise fallen on the gap.

An embodiment includes at least one computer that contains stored year long sun tracking data, such as sun angle for a given time. The computer operates one or more output electromechanical devices such as a motor or piezo electric device for altering slat positioning. In a preferred embodiment the computer additionally controls the proportion of radiant energy entering the powerskin that is converted into heat versus electric energy. In another embodiment the computer additionally controls the proportion of radiant energy entering the powerskin that is converted into heat versus allowed to pass through as room or building lighting. In yet another embodiment the computer additionally controls the proportion of radiant energy that enters the powerskin that is converted into heat, into electrical energy and allowed to pass as room lighting. In another embodiment the computer additionally controls shutter closure at night as desired depending on the time of year and/or outside temperature to minimize or maximize heat loss.

Powerskin Control Systems

A powerskin control system, in an embodiment, comprises at least one sensory input signal, at least one powerskin effector signal, a controller computer with a controlling program that accepts sensory data and outputs control signals, and at least one powerskin (i.e. converter that is adapted to be installed into a building, or that has become installed into a building). A powerskin may be controlled to 1) generate electricity via solar voltaic cells; (2) generate heat, by circulating air through an enclosure of the converter where most of the sunlight is absorbed directly or indirectly after reflection onto solar voltaic cells; and simultaneously (3) provide daylight out the back of the converter via scattered sunlight, and some of the diffuse sky light that comes in nearly parallel to reflecting surfaces of the slats. The control for one or more of these parameters may be automatic. For insulation, a controller can close blinds at night or when light intensity is below a specified threshold, indicates that more energy can saved by being in the maximum insulation mode instead of light collection. Closing the blinds at night automatically can enhance security by preventing views from outside in. Desirably, a control system trades off relative internal lighting versus heat collection versus electricity generation according to one or more algorithms that may be fashioned to maximize a desired condition.

In one automation embodiment, clouds passing overhead are detected, which affects electric output. In this situation, lighting can be enhanced by opening the slats to improve the "view factor" of the interior space to the sky and offsetting what might be dimmed lighting inside from the cloud effects. With this modification less lighting adjustment is needed with minimized loss of electric power for the temporary condition because the solar cell area is only illuminated by the missing direct sunlight. Somewhat simpler is the case of the sun going down or the sky becoming dark enough that the slats are oriented automatically to the night position for improved insulation and to minimize light loss through the collector aperture from interior lighting. Both operating modes are superior to conventional static skylights or window treatments.

Control systems can be connected to other building loads to minimize peak power draws from the building. Partly cloudy days can have substantially varying photoelectric output. However some loads like air conditioners, refrigeration systems, ventilation systems, or UPS charging systems can be modulated during periods of intermittent photoelectric power generation to drop the building's load when photoelectric power drops during cloudy moments. When sunlight returns or otherwise in a coordinated fashion these semi-discretionary loads can be turned back on or up. The "inertia" in the system (thermally for AC & refrigeration) allows negligible impact for such short duration modulation while potentially maximizing total electricity costs. This is because many larger buildings and power constrained areas meter power separately from energy to account for the utility's challenge to deliver enough power (generation, transmission and distribution infrastructures are sized for worst load scenario).

A control system can allow a building occupant to request a temporary change in the slat orientation to see something outside, dim the room, or other purpose. After a programmed time period, the system will resume energy generation mode. Such remote controls could operate similar to that of a garage door opener with RF or IR signals to minimize the wiring needed in the building. This mode would allow individual control over the window treatments at least temporarily to view outside depending on the slat orientation.

Powerskin Control Scheme Elements (Table)

Each one of the listed powerskin control elements, either alone or in combination with other elements, can be used to control one or more powerskins. For example, a room temperature signal, an inside thermostat setting signal and an outside light signal may be input to a controlling computer. The computer executes software that compares the inside thermostat setting with room temperature and controls the slat setting on the powerskin to harvest more heat from sunlight, if the outside light signal exceeds a threshold. In another embodiment, the computer accepts a presence of people in building signal, an inside light signal and an outside light signal and then directs a powerskin to divert more light inside the building to increase the building light to a target value. In another embodiment, a signal that indicates presence or absence of people inside of building or room is input and the controlling computer adjusts a powerskin to permit less outside light from entering the building upon detection of people leaving. In another embodiment a powerskin is directed to allow less light in and more heat instead when an input room light signal indicates that the lights have been turned off.

Exemplary data input signals include: room temperature, outdoor temperature, Inside-outside temperature differential, inside light, outside light, inside-outside light differential, time of year (warm vs. cold season), time of year (stored or calculated sun elevation angle or other parameter), time of day (stored or calculated sun elevation angle, azimuth), inside thermostat setting versus other data, inside light switch(es) on, presence of people in building, room (vacation days etc), and relative or absolute need for hot water. Exemplary output effector signals from the powerskin controller include: slat angle control, slat closure control, electrical conversion control, fan duct control (fan blows air along slats), intruder alarm based on shadows at night, substantially complete slat closure in one direction (reflective surface facing out) vs. opposite direction and non reflective or colored surface facing out.

A skilled artisan can optimize slat design for a particular installation by taking into account local weather patterns, installation orientation (tilt and azimuth), any local obstructions, the overall slat length used, and whether entry of diffuse interior daylight exit of light through the collector is desired. The representative powerskin control input elements and output elements listed above exemplify some of the parameters, but a skilled artisan readily will appreciate further useful parameters.

Powerskin Night Use

While designed primarily for radiation conversion, embodiments include useful features for night use. A powerskin can provide increased insulation compared to that of a facade when used over conventional construction surfaces, via automatic slat closure at night. Such automated movement can be used as a convective barrier. An enclosed converter with an extra layer of glass or backing adds another convection and/or conductive barrier. A powerskin can control light entry to automatically avoid bright and glare sections, which can reduce the effectiveness of interior space.

A powerskin can close reflective surface blinds at night to provide a reflective surface to the outside that minimizes nighttime lighting costs. In an embodiment the slats include one or more light emissive elements for further general external lighting or pattern creation such as advertising messages. A powerskin can provide security by automatically shielding from view the contents of a room from outside. In another embodiment, solar cell output from a converter at night is used to monitor the existence of or pattern of shadows that fall upon the side of a building and can be used for security purposes to alert the presence of unexpected or anomalous light patterns. In an embodiment, a controller compares patterns of shifting light activity to learn new patterns and also to learn patterns that indicate the approach of a person to a building.

Convex "inside" slat surfaces can be painted in a wide variety of colors or patterns to provide aesthetics or advertising that may be used in daytime or at night. The installation cost of a converter substantially may be reduced when the device does not require anchoring to a building exterior and can more easily survive wind, rain and temperature extremes that such an installation requires.

Portable Solar Energy System

Figure 12:
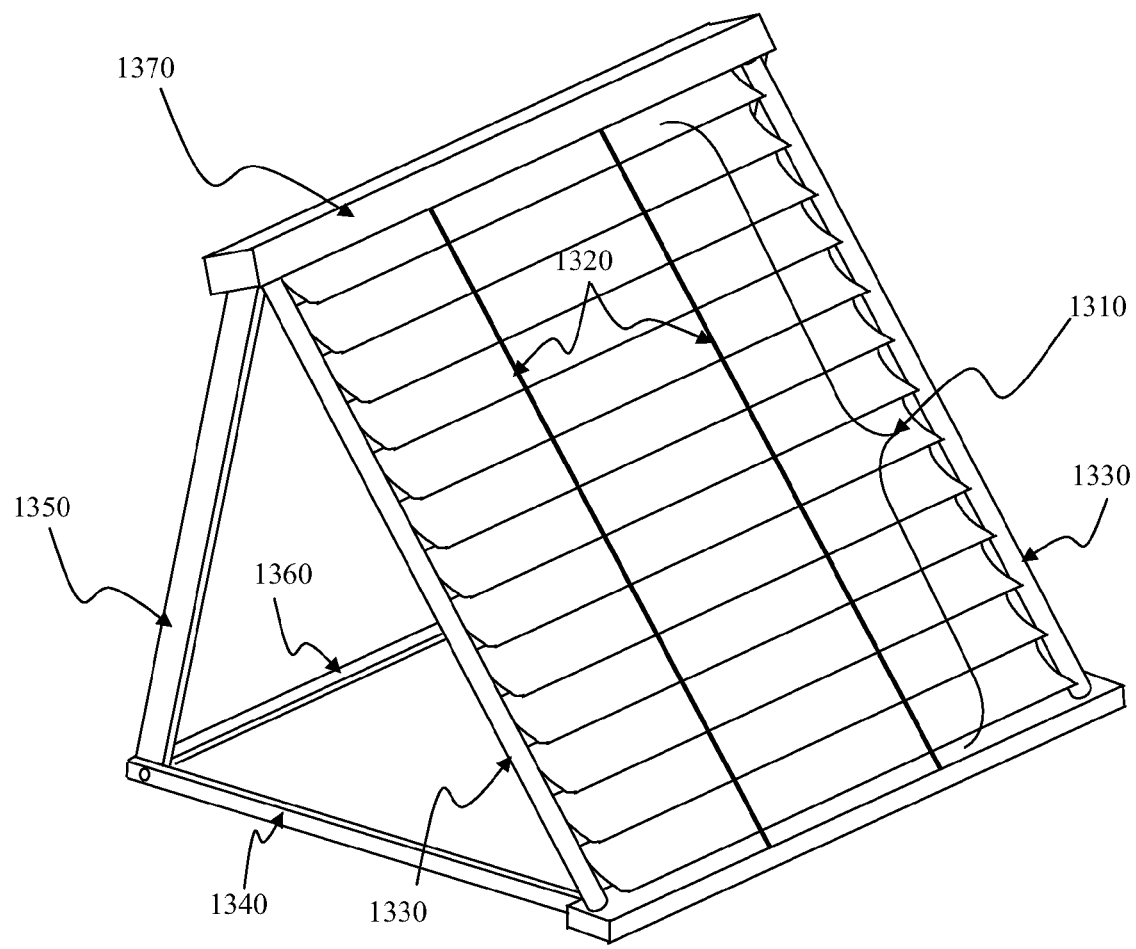
FIG. 12 shows a portable, collapsible converter.

A converter can be packaged with stacked slats, analogous to the packing of a Venetian blind when shipped from a factory as depicted in FIG. 12. Preferably slats 1310 are held together flexible, tensile elements (1320) when combined with adjustable compression member 1330 will deploy the slats into a plane. Other folding frame elements (1340, 1350, and 1360) allow the slat array to be tilted to improve sunlight capture. An automated slat rotation positioner is packaged in the top housing 1370 that extends and retracts 1320 members, much like a Venetian blind.

Glass or other glazing may be included as, for example, part of a kit. However, elimination of glazing engenders a far more compact (smaller volume and or weight) design for shipping compared to a conventional solar electric array. The ability to fold up a converter provides additional cost savings because of less solar cell surface needed. Optionally the converter may be stretched out and held in a variety of orientations to the ground and sun. The collapsible features provide an easy to ship product that can be integrated with strong mounting systems and glazing materials for a permanent installation using indigenous materials at a user site without requiring such extra parts with the primary optical device. In an embodiment, such foldable converter is provided and shipped as a light weight optics assembly with solar cells, and combined with locally available glazing to form a permanent device, such as a vertical powerskin or roof powerskin.

Other combinations of the inventive features described above, of course easily can be determined by a skilled artisan after having read this specification, and are included in the spirit and scope of the claimed invention. Documents cited herein specifically are incorporated in their entireties by reference.

We claim:

1. An electromagnetic energy harvesting converter, configured to simultaneously control solar electricity generation, solar thermal energy collection and light transmission from direct solar radiation, comprising:

a panel enclosure having a light transmissive front face spaced apart from a transparent or opaque enclosure rear face, wherein the space between said front face and said rear face defines a panel enclosure interior volume configured to control fluid flowing within said panel enclosure interior volume;

said panel enclosure interior volume housing an array of parallel reflective concave slats, each slat having a forward concave face that receives direct sunlight, and a rear face that receives reflected or indirect sunlight, wherein a selected plurality of slats carry at least one photovoltaic energy converter mounted on the rear face of said selected slats are positioned and configured to receive said reflected sunlight directly after a single reflection from said forward concave face of an adjacent concave slat, and wherein each slat is connected by a shared linkage and is controllable to aim said reflected sunlight and to expose a selected amount of said slat forward concave face to said direct sunlight;

wherein said electromagnetic energy harvesting converter is configured to, through modification of an orientation of said selected plurality of slats with respect to said light transmissive front face, generate electrical energy from said photovoltaic energy converters at various of said orientations of said selected plurality of slats, while simultaneously (a) collecting a selected amount of thermal energy from said solar radiation within said panel enclosure and (b) controlling the amount of sunlight permitted to pass through said panel enclosure's front face, past said slats and through said enclosure rear face to provide a selected amount of light transmission through said panel.

2. The converter of claim 1, wherein some of said slats are oriented and shaped to reflect direct sunlight through said enclosure rear face.

3. The converter of claim 1, wherein at least some of said slats are oriented to reflect and concentrate the light onto photovoltaic energy converters mounted on the back sides of nearby slats.

4. The converter of claim 1, wherein said shared linkage is controlled through an actuation system that rotates the slats.

5. The converter of claim 1, further comprising an electrically conductive material that electrically connects the photovoltaic energy converters to an external load by flat conductors.

6. The converter of claim 1, wherein the photovoltaic energy converters are bonded to the slats with thermally conductive material.

7. The converter of claim 1, further comprising diode shunts between said photovoltaic energy converters that allow selective bypass of at least portions of a slat.

8. The converter of claim 1, further comprising a light sensitive control system that is configured to change slat orientation with respect to intensity or orientation of incident light.

9. The converter of claim 1, wherein a slat forward face is concave shaped sufficiently to allow concentration of light onto the rear section of a nearby slat.

10. The converter of claim 1, further comprising planar slats that lack photovoltaic energy converters.

11. A window comprising the converter of claim 10, the planar slats are positioned on an upper side of the converter to guide direct sunlight near a ceiling.

12. An electromagnetic energy harvesting converter, comprising:
   a. an enclosure having a front light transmissive cover and a rear cover;
   b. an enclosed space between the covers;
   c. a forced air generator arranged to induce air flow within the enclosure, thereby removing solar heat from the enclosed space; and an array of parallel arranged slats within the enclosed space, each slat having mounted thereon one or more photovoltaic energy converters, and wherein each slat has a forward face that receives light directly, and at least some slats are oriented to reflect and concentrate said light onto photovoltaic energy converters mounted on the back side of a nearby slat; and wherein said slats' photovoltaic energy converters are positioned and configured to receive said reflected light directly after a single reflection from said forward face of an adjacent slat and throughout a range of angular orientations of said slats with respect to said enclosure, and wherein each slat is connected by a shared linkage and is controllable to aim said reflected light and to expose a selected amount of said slat forward face to said light.

13. The converter of claim 12, wherein air from the forced air generator is directed to move along the long axis of the slats.

14. The converter of claim 12, wherein the rear cover of the enclosure is transparent.

15. A building with exterior surfaces defining a weather envelope and comprising the converter of claim 12, wherein the front light transmissive cover is integrated in the building's weather envelope.

16. The building of claim 15, wherein at least the front light transmissive cover or rear cover is a skylight.

17. The building of claim 15, wherein the front light transmissive cover is a wall or window.

18. A solar energy conversion system which is controllable and configurable to selectively control a building occupant's access to heat and light from incident sunlight within a building's interior, comprising:
   a. an enclosure having a front light transmissive cover configured and positioned for direct exposure to incident sunlight and a rear light transmissive cover configured and positioned for exposure to occupants inside the building;
   b. an enclosed interior volume defined between said front and rear covers which is illuminated by the incident sunlight and simultaneously heated by the incident sunlight to generate solar heat, and said interior volume enclosing an array of parallel concave slats;
   c. a forced fluid flow generator arranged to induce fluid flow within the enclosure's interior volume, thereby removing solar heat from the slats; wherein said array of parallel concave slats is movably mounted within the interior volume, wherein each slat has a forward concave face that is controllable to substantially reflect, block and receive solar heat from said incident sunlight, and at least some slats are oriented to pass or reflect light into the building's interior, and wherein said slats' concave faces are configured to receive and reflect said sunlight after a single reflection onto a light-to-energy converter positioned on a convex face of an adjacent slat throughout a range of angular orientations of said slats with respect to said enclosure, and wherein each slat is connected by a shared linkage and is controllable to aim said reflected light and to expose a selected amount of said slat forward concave face to said sunlight.

* * * * *

UNITED STATES PATENT AND TRADEMARK OFFICE
CERTIFICATE OF CORRECTION

PATENT NO. : 9,057,535 B2
APPLICATION NO. : 12/349728
DATED : June 16, 2015
INVENTOR(S) : Scott Frazier and Rik Deaton It is certified that error appears in the above-identified patent and that said Letters Patent is hereby corrected as shown below:

In the Claims column 18, line 63, claim 1, should read as follows:

-- 1. An electromagnetic energy harvesting converter, configured to simultaneously control solar electricity generation, solar thermal energy collection and light transmission from direct solar radiation, comprising:

a panel enclosure having a light transmissive front face spaced apart from a transparent or opaque enclosure rear face, wherein the space between said front face and said rear face defines a panel enclosure interior volume configured to control fluid flowing within said panel enclosure interior volume;

said panel enclosure interior volume housing an array of parallel reflective concave slats, each slat having a forward concave face that receives direct sunlight, and a rear face that receives reflected or indirect sunlight, wherein a selected plurality of slats carry at least one photovoltaic energy converter mounted on the rear face of said selected slats positioned and configured to receive said reflected sunlight directly after a single reflection from said forward concave face of an adjacent concave slat, and wherein each slat is connected by a shared linkage and is controllable to aim said reflected sunlight and to expose a selected amount of said slat forward concave face to said direct sunlight;

wherein said electromagnetic energy harvesting converter is configured to, through modification of an orientation of said selected plurality of slats with respect to said light transmissive front face, generate electrical energy from said photovoltaic energy converters at various of said orientations of said selected plurality of slats, while simultaneously (a) collecting a selected amount of thermal energy from said solar radiation within said panel enclosure and (b) controlling the amount of sunlight permitted to pass through said panel enclosure's front face, past said slats and through said enclosure rear face to provide a selected amount of light transmission through said panel. --.

Signed and Sealed this
Twelfth Day of January, 2016

Michelle K. Lee
*Director of the United States Patent and Trademark Office*